(12) United States Patent
Hashimoto

(10) Patent No.: US 6,472,726 B1
(45) Date of Patent: Oct. 29, 2002

(54) SEMICONDUCTOR DEVICE AND METHOD OF FABRICATION THEREOF, SEMICONDUCTOR MODULE, CIRCUIT BOARD, AND ELECTRONIC EQUIPMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/509,403

(22) PCT Filed: Jul. 23, 1999

(86) PCT No.: PCT/JP99/03956

§ 371 (c)(1),
(2), (4) Date: Jul. 7, 2000

(87) PCT Pub. No.: WO00/07235

PCT Pub. Date: Feb. 10, 2000

(30) Foreign Application Priority Data

Jul. 28, 1998 (JP) .......................................... 10-227625
Jun. 4, 1999 (JP) .......................................... 11-158278

(51) Int. Cl.[7] ...................... H01L 23/52; H01L 23/495
(52) U.S. Cl. ...................... 257/668; 257/723; 257/783; 257/797
(58) Field of Search ................................ 257/678, 222, 257/723, 783, 797, 668; 438/107, 109, 110, 123

(56) References Cited

U.S. PATENT DOCUMENTS

| 5,061,988 A | * 10/1991 | Rector ........................ 361/404 |
| 5,073,817 A | * 12/1991 | Ueda .......................... 257/787 |
| 5,749,997 A | 5/1998 | Tang et al. ................... 156/249 |
| 5,759,873 A | 6/1998 | Kata et al. ................... 438/118 |
| 5,918,113 A | 6/1999 | Higashi et al. ............. 438/119 |
| 5,965,947 A | * 10/1999 | Nam et al. ................... 257/783 |
| 6,097,610 A | * 8/2000 | Hashinoto .................... 361/760 |
| 6,111,324 A | * 8/2000 | Sheppard et al. ........... 257/787 |
| 6,205,745 B1 | * 3/2001 | Dudderar et al. ............. 29/743 |

FOREIGN PATENT DOCUMENTS

| JP | 06163617 A | 6/1994 |
| JP | A 6-163617 | 6/1994 |
| JP | 6-163617 | * 10/1994 |
| JP | A 8-222600 | 8/1996 |
| JP | 08222600 A | 8/1996 |
| JP | A 9-115950 | 5/1997 |
| JP | A 9-293749 | 11/1997 |
| JP | A 10-84014 | 3/1998 |
| JP | 10084014 A | 3/1998 |

* cited by examiner

*Primary Examiner*—Jasmine J B Clark
(74) *Attorney, Agent, or Firm*—Oliff & Berridge, PLC

(57) ABSTRACT

A semiconductor device and method for fabricating a semiconductor device. Semiconductor chips are affixed by an adhesive to a tape carrier on which bonding portions are formed in a matrix. Electrodes formed on the semiconductor chips are electrically connected to the bonding portions. The tape carrier is then divided into individual units for each of the semiconductor chips.

42 Claims, 13 Drawing Sheets

SEMICONDUCTOR DEVICE AND METHOD OF FABRICATION THEREOF, SEMICONDUCTOR MODULE, CIRCUIT BOARD, AND ELECTRONIC EQUIPMENT

TECHNICAL FIELD

This invention relates to a semiconductor device and a method of fabrication thereof, together with a semiconductor module, a circuit board, and electronic equipment.

BACKGROUND ART

One result of the recent miniaturization of electronic equipment is a demand for semiconductor device packages that can be used for high-density mounting. To address this demand, surface-mount packages such as a ball grid array (BGA) or chip scale/size package (CSP) have been developed. Surface-mount packages make it possible to use a substrate on which is formed an interconnecting pattern to be connected to semiconductor chips.

However, it is difficult with surface-mount packages in the prior art to improve the reliability and productivity, because the connections between the semiconductor chips and the interconnecting pattern are done by an alloy such as solder.

The present invention was devised in order to solve the above problems in the art. The objective thereof is to provide a method of fabricating a semiconductor device that has superior reliability and productivity, together with a semiconductor device formed by this method, a semiconductor module, a circuit board, and electronic equipment.

DISCLOSURE OF THE INVENTION (1) A method of fabricating a semiconductor device in accordance with this invention comprises the steps of: affixing semiconductor chips by an adhesive to a tape carrier on which are formed bonding portions in a matrix; connecting electrodes formed on the semiconductor chips electrically to the bonding portions; and dividing the tape carrier into individual units for each of the semiconductor chips.

In this invention, bonding portions are any portions for connection to individual semiconductor chips, and could comprise lands for connecting electrodes of the semiconductor chips, lands for forming external electrodes, or wiring for connecting these lands, by way of example. These bonding portions are provided on the substrate and they do not protrude into device holes.

In this aspect of the invention, a plurality of bonding portions are formed across the width of the tape carrier and a plurality of semiconductor chips are connected thereto. This makes it possible to mount a plurality of semiconductor chips across the width of the tape carrier, so that a large quantity of semiconductor devices can be fabricated.

(2) This method of fabricating a semiconductor device may further comprise a step of forming a plurality of external electrodes on the tape carrier.

(3) In this method of fabricating a semiconductor device, the step of dividing the tape carrier into individual units may involve stamping the tape carrier into individual units.

(4) In this method of fabricating a semiconductor device, electrically conductive particles may be dispersed within the adhesive, whereby the bonding portions and the semiconductor chips are electrically connected.

The bonding portions and the electrodes are electrically connected by the electrically conductive particles in this aspect of the invention, making it possible to fabricate semiconductor devices by a method that has superior reliability and productivity.

(5) In this method of fabricating a semiconductor device, the adhesive may be interposed between the bonding portions and surfaces of the semiconductor chips bearing the electrodes, then pressure may be applied between the semiconductor chips and the tape carrier, whereby connections between the electrodes formed on the semiconductor chips and the bonding portions are performed via the electrically conductive particles.

(6) In this method of fabricating a semiconductor device, the tape carrier may be unwound from a reel, and the tape carrier may be wound onto another reel while the execution of at least one of the steps of the method, in preparation for a next step.

Since this ensures that each step can be performed in a reel-to-reel manner, it makes it possible to fabricate the semiconductor devices smoothly.

(7) In this method of fabricating a semiconductor device, at least one of the steps of this method may be performed after a step of cutting the tape carrier into rectangular substrates of a length comprising a plurality of the bonding portions in the longitudinal direction of the tape carrier.

Since this enables a step or steps to be performed on the rectangular substrate, this is more efficient for short production runs than steps performed during reel-to-reel processing.

(8) In this method of fabricating a semiconductor device, identification marks may be formed in the tape carrier, for delimiting the bonding portions at positions within regions at which the tape carrier is to be cut into the rectangular substrates.

This configuration makes it possible to easily identify the cutting positions when the tape carrier is cut into rectangular substrates.

(9) In this method of fabricating a semiconductor device, the step of cutting the tape carrier into rectangular substrates may be performed before the semiconductor chips are affixed to the tape carrier; and the tape carrier may be cut on widthwise lines of the bonding portions that are the (integer n×constant d)th widthwise lines of the bonding portions in the longitudinal direction, with any one line of the bonding portions across the width of the tape carrier acting as a base line.

This ensures that a usable tape carrier is used, even if it is not cut into rectangular substrates. The tape carrier is cut on bonding portions at predetermined positions. In this case, since the tape carrier is cut on the bonding portions, wider cutting regions can be ensured than in a case in which the tape carrier is cut between adjacent bonding portions. As a result, not only is the cutting operation facilitated, but no stress is imparted to the remaining bonding portions on the rectangular substrate during the cutting, enabling an improvement in the yield.

(10) In this method of fabricating a semiconductor device,
  the step of affixing the semiconductor chips to the tape carrier may be performed before the step of cutting the tape carrier into rectangular substrates;
  the semiconductor chips may be mounted on the bonding portions, except for the bonding portions in the (integer n×constant k)th widthwise lines of the bonding portions in the longitudinal direction, with any one line of the bonding portions across the width of the tape carrier acting as a base line; and the tape carrier may be cut on widthwise lines of interconnecting pattern that are the (integer n×constant d)th (where k≦d) widthwise lines of the interconnecting pattern in the longitudinal direction from the base line.

The tape carrier is cut into rectangular substrates after the semiconductor chips are mounted thereon, so this configuration ensures that there are no semiconductor chips mounted at the cutting positions. The tape carrier is cut on the bonding portions where there are no semiconductor chips. Since the tape carrier is cut on the bonding portions, it is possible to ensure wider cutting regions than if the tape were cut between adjacent bonding portions. As a result, not only is the cutting operation facilitated, but no stress is imparted to the remaining bonding portions on the rectangular substrate during the cutting, enabling an improvement in the yield.

(11) In this method of fabricating a semiconductor device,
the bonding portions may be formed on the tape carrier, except for widthwise lines of regions for the formation of the bonding portions that are the (integer n×constant k)th widthwise lines of the regions for the formation of the bonding portions in the longitudinal direction, with any one line of the region for the formation of the bonding portions acting as a base line;

the step of cutting the tape carrier into rectangular substrates may be performed before the semiconductor chips are affixed to the tape carrier, and the tape carrier may be cut on widthwise lines of the regions for the formation of interconnecting pattern that are the (integer n×constant d)th (where k≦d) widthwise lines of the regions for the formation of the interconnecting pattern in the longitudinal direction from the base line.

This ensures that there are no bonding portions in the widthwise line of the region for the formation of the bonding portions that is at each position for the cutting of rectangular substrates. This makes it possible to ensure wider cutting regions. As a result, not only is the cutting operation facilitated, but no stress is imparted to the remaining bonding portions on the rectangular substrate during the cutting, enabling an improvement in the yield. Moreover, since the regions in which no bonding portions are formed are guaranteed to be of the width of the region for the formation of bonding portions, there is no slippage of the positions at which the bonding portions are formed. It is therefore not difficult to identify the positions of the bonding portions.

(12) In this method of fabricating a semiconductor device,
the bonding portions may be formed on the tape carrier, except for widthwise lines of regions for the formation of the bonding portions that are the (integer n×constant k)th widthwise lines of the regions for the formation of the bonding portions in the longitudinal direction, with any one line of the region for the formation of the bonding portions acting as a base line;

the step of affixing the semiconductor chips to the tape carrier is performed before the step of cutting the tape carrier into rectangular substrates;

the semiconductor chips may be affixed to the tape carrier only on regions wherein the bonding portions are formed; and the tape carrier may be cut on widthwise lines of the regions for the formation of interconnecting pattern that are the (integer n×constant d)th (where k≦d) widthwise lines of the regions for the formation of the interconnecting pattern in the longitudinal direction from the base line.

Since the tape carrier is cut into rectangular substrates after the semiconductor chips have been mounted, this configuration ensures that no semiconductor chips are mounted at the cutting positions. In addition, no bonding portions are formed in the widthwise lines of the regions for the formation of the bonding portions at the cutting positions. This makes it possible to ensure wider cutting regions. As a result, not only is the cutting operation facilitated, but no stress is imparted to the remaining bonding portions on the rectangular substrate during the cutting, enabling an improvement in the yield. Moreover, an area equivalent to the region for the formation of the bonding portions is ensured even in the region where no bonding portions are formed, so there is no slippage of the positions at which the bonding portions are formed. It is therefore not difficult to identify the positions of the bonding portions. The tape carrier is cut at positions where there are no bonding portions or semiconductor chips.

(13) In this method of fabricating a semiconductor device,
a sprocket hole and a positioning hole may be formed in the tape carrier; and the steps of this method may be performed with the positioning hole acting as a base position.

This configuration makes it possible for the positioning hole to act as a base position for determining various positions, even if the sprocket holes deform during the unwinding of the tape carrier.

(14) In this method of fabricating a semiconductor device,
through-holes may be formed in the tape carrier; and the external electrodes may be connected to the bonding portions through the through-holes, and may also be provided on a surface on the opposite side from the surface on which the bonding portions are formed.

(15) In this method of fabricating a semiconductor device,
the step of forming the external electrodes on the tape carrier may comprise a step of mounting a material for forming the external electrodes onto the tape carrier and a reflow step of heating and melting the material to form ball shapes.

(16) A semiconductor module in accordance with this invention comprises:
a rectangular substrate on which bonding portions are formed in a matrix;
a plurality of semiconductor chips to be disposed at positions corresponding to the bonding portions; and
an adhesive for connecting the rectangular substrate and the semiconductor chips.

With this aspect of the invention, semiconductor chips can be mounted on a rectangular substrate in a matrix (a plurality of rows and a plurality of columns), making it possible to mount a large number of semiconductor chips on a single rectangular substrate and thus enabling an improvement in the productivity of semiconductor devices. With this aspect of the invention, bonding portions are any portions for connection to individual semiconductor chips, and could comprise lands for connecting electrodes of the semiconductor chips, lands for forming external electrodes, or wiring for connecting these lands, by way of example. These bonding portions are provided on the substrate and do not protrude into device holes.

(17) In this semiconductor module,
the adhesive may be formed of an anisotropic conductive film;
the anisotropic conductive film may be interposed between surfaces of the semiconductor chips on which electrodes are formed and the bonding portions; and
the bonding portions and the electrodes may be electrically connected by electrically conductive particles comprised within the anisotropic conductive film.

This means that the bonding portions and electrodes are connected electrically by the anisotropic conductive film, ensuring a more reliable electrical connection.

(18) In this semiconductor module, through-holes may be formed in the rectangular substrate; and external electrodes may be formed on a surface of the rectangular substrate opposite to a surface of the rectangular substrate on which the bonding portions are formed, to be connected electrically to the bonding portions by the through-holes.

(19) A semiconductor device in accordance with this invention is fabricated by the above described method.

(20) A circuit board in accordance with this invention comprises the above described semiconductor device mounted thereon.

(21) Electronic equipment in accordance with this invention has the above described circuit board.

BEST MODE FOR CARRYING OUT THE INVENTION

Preferred embodiments of this invention are described below with reference to the accompanying drawings.

First Embodiment

Figure 1:
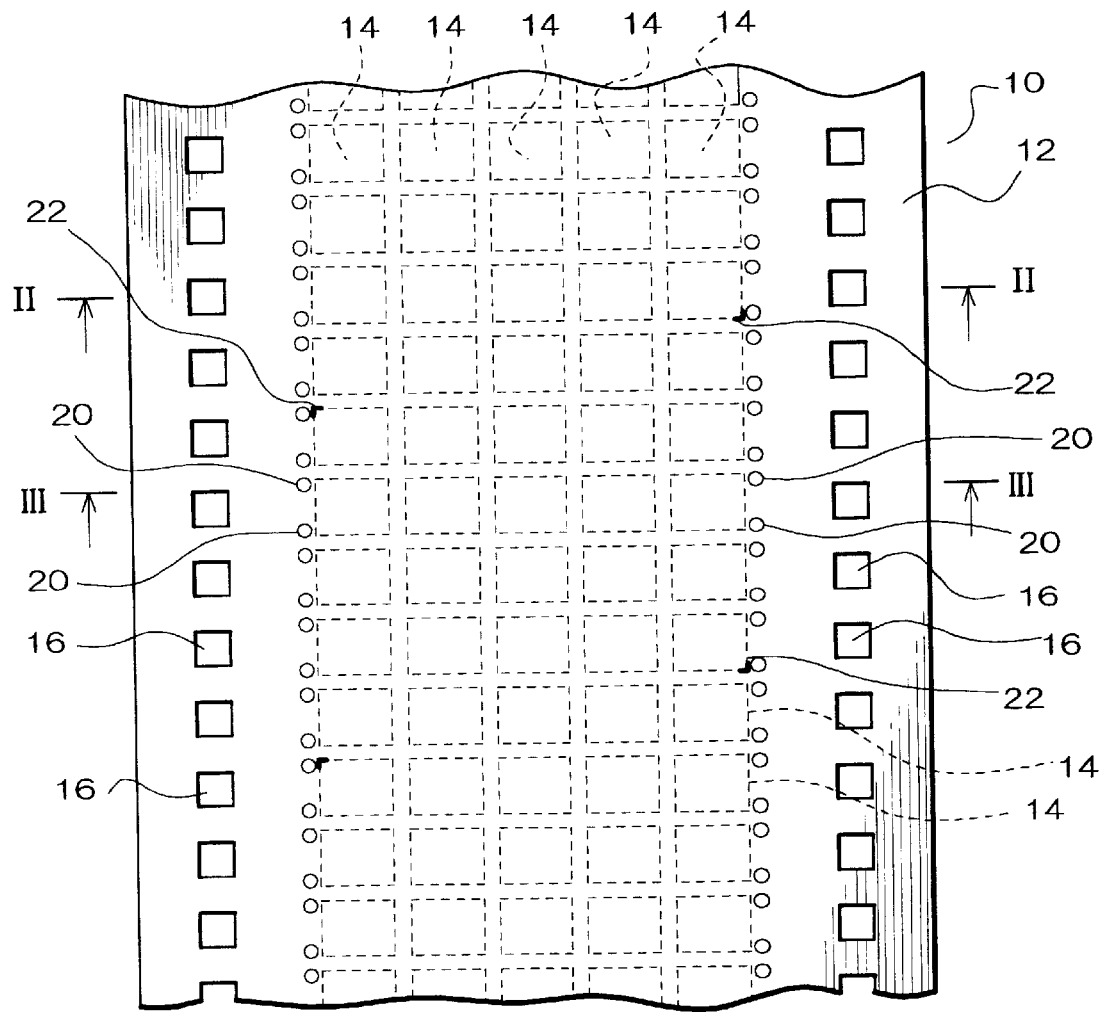
FIG. 1 illustrates a method of fabricating a semiconductor device in accordance with a first embodiment to which this invention is applied.
Figure 2:
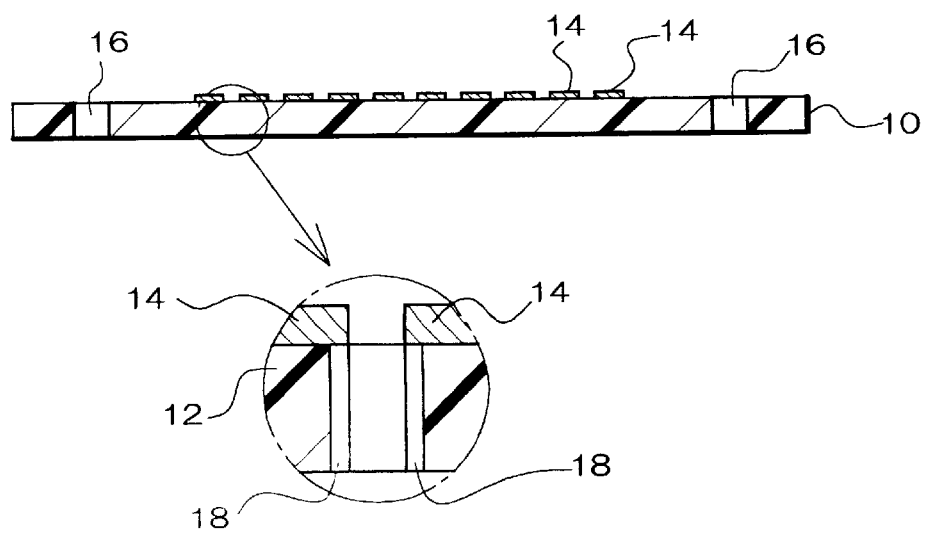
FIG. 2 further illustrates the method of fabricating a semiconductor device in accordance with the first embodiment.
Figure 3:
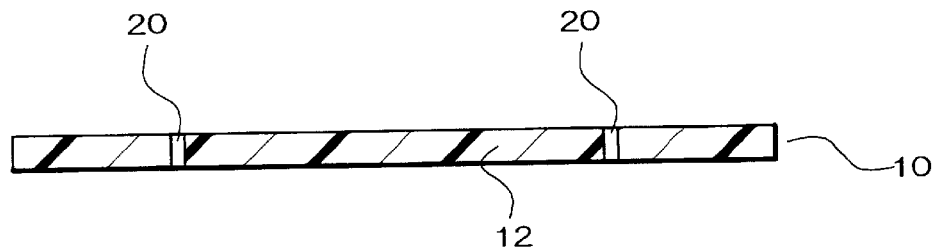
FIG. 3 further illustrates the method of fabricating a semiconductor device in accordance with the first embodiment.

A method of fabricating a semiconductor device in accordance with a first embodiment of this invention is shown in FIGS. 1 to 9. A tape carrier 10 shown in FIG. 1 is used for this embodiment. A cross-sectional view taken along the line II—II of FIG. 1 is shown in FIG. 2 and a cross-sectional view taken along the line III—III of FIG. 1 is shown in FIG. 3. In each figure, the ratios of thickness and dimensions of components are different from those used in practice, for purposes of illustration, and thus the invention is not limited to those ratios.

The tape carrier 10 comprises a substrate 12 of a long strip or tape form, and a plurality of bonding portions 14 formed on at least one surface of the substrate 12, and the tape carrier 10 is wound onto a reel (not shown in the figures). Note that the tape carrier 10 could be either a three-layer tape wherein the bonding portions 14 are formed by a method such as etching after an electrically conductive foil such as copper foil has been affixed to the substrate 12 by an adhesive, or a two-layer tape wherein no adhesive is used. With a two-layer tape, either an electrically conductive film such as a copper film is deposited on the substrate by a method such as sputtering and this film is etched to form the bonding portions, or a varnish of a polyimide resin or the like is applied to electrically conductive foil such as copper foil, then the varnish is cured to form a substrate and bonding portions are formed thereon.

The substrate 12 could be formed of any organic or plastic material that is used for general-purpose tape carriers, but the material is not limited in any manner provided it is flexible. A two-layer tape without any adhesive generally has a superior flexibility than a three-layer tape. To further increase the flexibility, local measures such as punching or overhanging could be applied, similar to those used in methods such as tape automated bonding (TAB).

Sprocket holes 16 are formed continuously in the longitudinal direction along both widthwise edge portions of the substrate 12. These sprocket holes 16 are designed to engage with sprockets (not shown in the figures) when the tape carrier 10 is being wound and unwound.

Through-holes 18 are formed in the substrate 12, as shown in the enlargement within FIG. 2. One opening of each of the through-holes 18 is covered and blocked by one of the bonding portions 14. In other words, the bonding portions 14 are formed to overlap (overhang) the through-holes 18. of course it is also possible to use standard through-holes that have openings on both sides of the substrate 12. The base material of the substrate 12 could be exposed on the inner surfaces of the through-holes 18, as shown in FIG. 2, but if necessary it could be covered with plating of a material such as copper. This configuration makes it possible to form an electrical connection through the through-holes 18 from the bonding portions 14 formed on one surface of the substrate 12 to external electrodes 38 (see FIG. 7D) formed on the other surface thereof.

A plurality of the bonding portions 14 are formed in the lateral direction of the substrate 12 and also this pattern is repeated in the longitudinal direction thereof. The bonding portions 14 are formed on top of the substrate 12 and do not protrude into device holes. Since this makes it unnecessary to form device holes in the substrate 12, it is possible to use a tape carrier 10 that does not have device holes. Such a tape carrier 10 has little distortion because there are no device holes. One semiconductor chip 32 is connected to each bonding portion 14 (see FIG. 7B). The bonding portions 14 are portions for connection to individual semiconductor chips 32, and comprise lands for connecting electrodes 34 of the semiconductor chips 32, lands for forming the external electrodes 38 (see FIG. 7D), or wiring for connecting these lands, by way of example. Note that only the region in which the bonding portions 14 are formed is shown in FIG. 1; other details are omitted. In this embodiment of the invention, a plurality of bonding portions 14 are formed in the lateral direction of the substrate 12, so that a plurality of semiconductor chips 32 can be mounted across the width of the substrate 12. These bonding portions 14 are formed in such a manner that a pattern thereof is repeated along the length of the substrate 12, so that the semiconductor chips 32 can be mounted in a repeating pattern along the length of the substrate 12.

Positioning holes 20 for marking the positions of the bonding portions 14 are formed in the substrate 12, as shown in FIG. 3. More specifically, the positioning holes 20 are formed further towards the edges than bonding portions 14 that are positioned at the outer sides across the width of the substrate 12, of the bonding portions 14 that are arrayed in lines across the width of the substrate 12. A pair of the positioning holes 20 are formed in the vicinity of two corner portions of these bonding portions 14. The thus formed positioning holes 20 make it possible to identify the position of the line of bonding portions 14 formed across the width of the substrate 12.

Pairs of identification marks 22 are formed on the substrate 12, as shown in FIG. 1. These identification marks 22 are arranged in such a manner as to make it possible to identify sections of the bonding portions 14 that are arrayed in a matrix of a plurality of rows and a plurality of columns. In this embodiment of the invention, pairs of L-shaped identification marks 22 are formed in such a manner as to divide the bonding portions 14 into sections consisting of four portions in the longitudinal direction of the substrate 12 and five portions in the lateral direction thereof, in other words, into groups of 4×5. It should be obvious that the number of bonding portions 14 sectioned of f by each pair of identification marks 22 and the shape of the identification marks 22 can be determined as required. If a two-layer tape is used, the identification marks 22 can be formed of the same material and at the same time as the bonding portions 14.

The pairs of identification marks 22 divide the matrix of bonding portions 14 into sections that exclude lines of the bonding portions 14 across the width of the substrate 12. In other words, a line of bonding portions 14 across the width of the substrate 12 remains between one matrix of bonding portions 14 sectioned off by a pair of identification marks 22 and the neighboring matrix of bonding portions 14 sectioned off by another pair of identification marks 22. When a line of the bonding portions 14 across the width of the tape carrier 10 acts as a base line, the (integer n×constant k)th widthwise line of bonding portions 14 along the length of the tape carrier 10 is excluded from these sections. In the embodiment shown in FIG. 1, for example: k=5. Therefore, with any line of bonding portions 14 acting as a base line, the 5th, 10th, 15th, 20th, etc., lines of bonding portions 14 in the longitudinal direction are outside the sections delimited by the pairs of identification marks 22. These lines of bonding portions 14 outside these sections are used as cutting regions. For example, if it is desired for the tape carrier to move as a rectangular substrate after a solder ball formation step, which will be described later, the tape carrier 10 can be cut apart after a face-down bonding step, which will also be described later. This embodiment is advantageous in that it make it possible to cut the tape into rectangular substrates at any step. A further characteristic of this embodiment is an increase in the flexibility in the winding direction, because of the presence of places with open lines.

Figure 4:
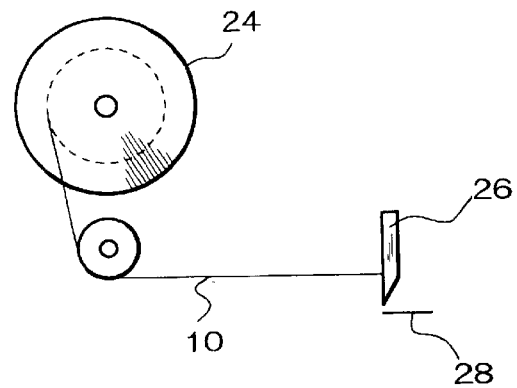
FIG. 4 further illustrates the method of fabricating a semiconductor device in accordance with the first embodiment.
Figure 5:
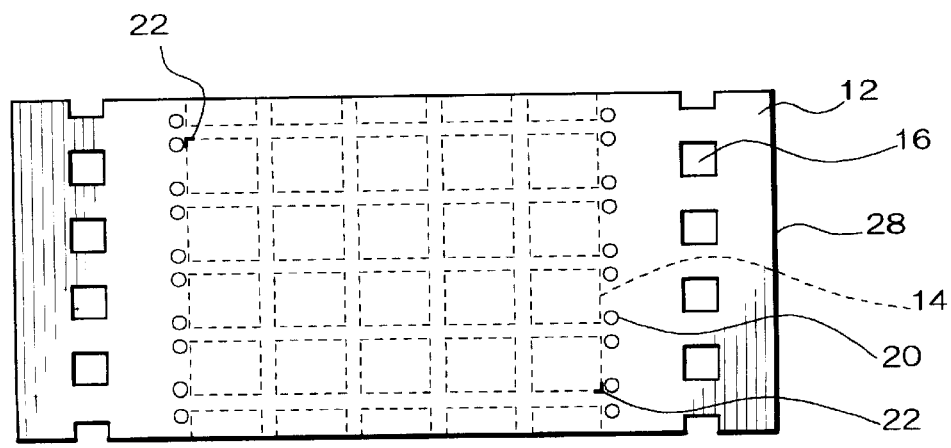
FIG. 5 further illustrates the method of fabricating a semiconductor device in accordance with the first embodiment.

A step of cutting the tape carrier 10 is shown in FIG. 4. As shown in this figure, the tape carrier 10 is wound onto the reel 24 in preparation. The tape carrier 10 is unwound from the reel 24 and is cut into rectangular substrates 28 by a cutting tool 26 such as a cutter. One of these rectangular substrates 28 is shown in FIG. 5.

Each cutting position on the tape carrier 10 is on a widthwise line of bonding portions 14 that is the (integer n×constant d)th such line in the longitudinal direction, with any widthwise line of bonding portions 14 on the tape carrier 10 acting as a base line. In this embodiment shown in FIG. 1, for example: d=5. Therefore, the tape carrier 10 is cut on the 5th, 10th, 15th, 20th, etc., lines of the bonding portions 14 in the longitudinal direction, with any line of bonding portions 14 acting as a base line.

Since this ensures that the tape carrier 10 is cut on the bonding portions 14, it is possible to ensure wider cutting regions than when the cutting is done between bonding portions that are adjacent in the longitudinal direction. As a result, not only is the cutting operation facilitated, but no stress is imparted to the remaining bonding portions 14 on the rectangular substrate 28 of FIG. 5 during the cutting, enabling an improvement in the yield.

Note that, in this embodiment, the tape carrier 10 is cut on all of the lines of bonding portions 14 outside the sections delimited by the identification marks 22, because this example is a case in which: k=d=5. Therefore, the tape carrier 10 is cut on all of the lines of bonding portions 14 that are outside the sections delimited by the pairs of identification marks 22.

Figure 6:
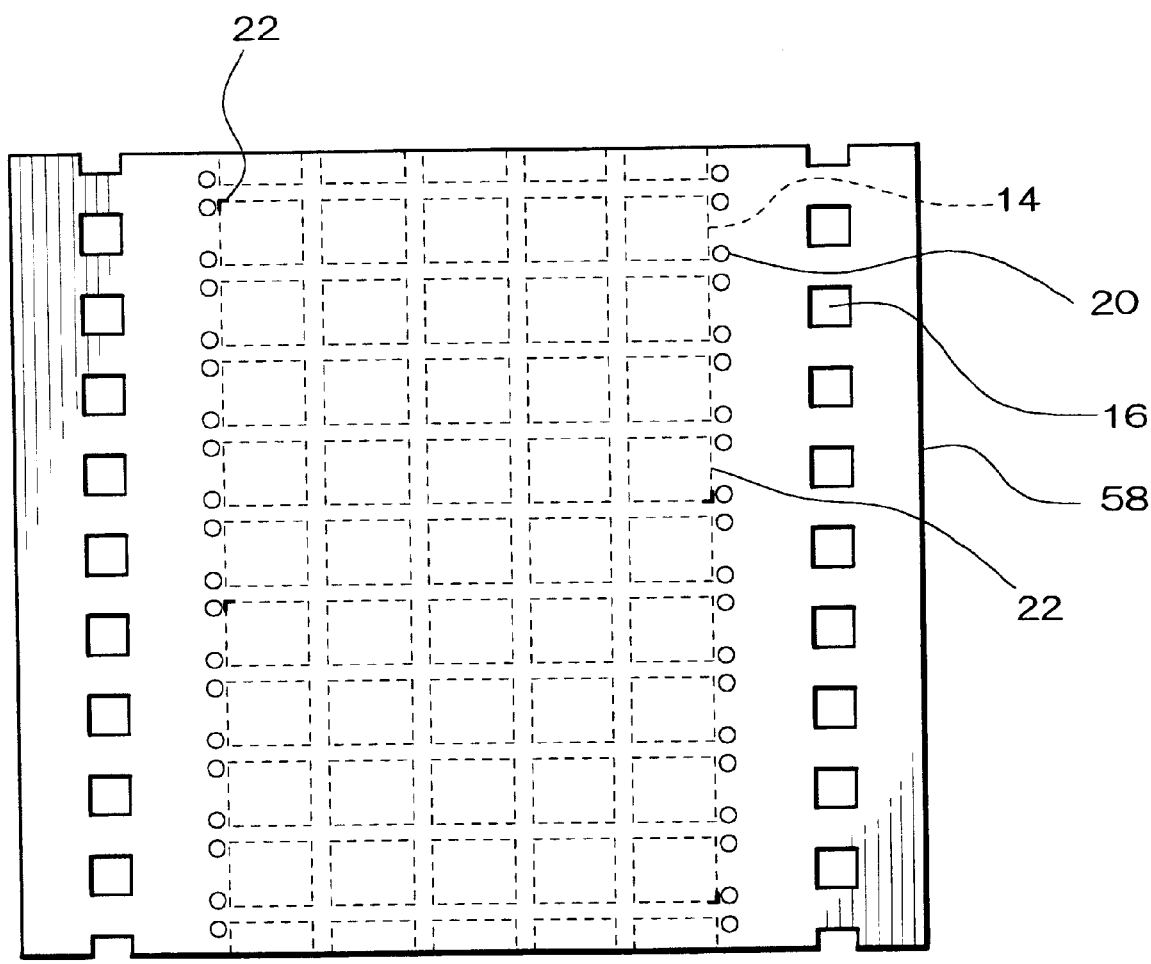
FIG. 6 further illustrates the method of fabricating a semiconductor device in accordance with the first embodiment.

In a variation: k<d, so that the tape carrier 10 could be cut into rectangular substrate 58, as shown in FIG. 6. Each rectangular substrate 58 is obtained by cutting the tape carrier 10 only on selected lines of bonding portions 14, of all the lines of bonding portions 14 that are outside the sections delimited by the identification marks 22. More specifically, in the formula (integer n×constant d) for determining the cutting positions for the tape carrier 10 in the example shown in FIG. 6: d=10. The tape carrier 10 is cut on the 10th, 20th, 30th, etc., lines of bonding portions 14 in the longitudinal direction, with any line of bonding portions 14 acting as a base line. A plurality of matrices of bonding portions 14 are formed on the rectangular substrate 58, delimited by a plurality of pairs of identification marks 22. A line of bonding portions 14 is formed between adjacent matrices of bonding portions, outside the sections delimited by the identification marks 22.

The identification marks 22 formed as described above could overhang the through-holes 18. This makes it possible to check the identification marks 22 from the rear surface of the tape carrier 10 before the formation of solder balls, for example. The yield can be further improved thereby.

Once the rectangular substrate 28 or 58 of FIG. 5 or FIG. 6 has been obtained, the processing proceeds to the next step. The steps described below are based on the example of the rectangular substrate 28 of FIG. 5.

In this embodiment of the invention, the mounting of the semiconductor chips 32 could be done by either face-up bonding or face-down bonding. With face-up bonding, the bonding portions 14 are often connected to the electrodes 34 of the semiconductor chips 32 by wire bonding or TAB bonding, then the positions at which the semiconductor chips 32 are mounted are subsequently covered with resin. With face-down bonding, various forms could be used, such as bonding by an electrically conductive resin paste, metal connections by Au—Au, Au—Sn, a solder or the like, or shrink-bonding with an insulating resin. For this embodiment, a method of face-down bonding the semiconductor chips 32 by using an anisotropic conductive film 30 is described. The anisotropic conductive film 30 is used as an adhesive in this embodiment, but the present invention could also be applied to a case in which the semiconductor chips 32 are affixed by an insulating adhesive.

Figure 7A:
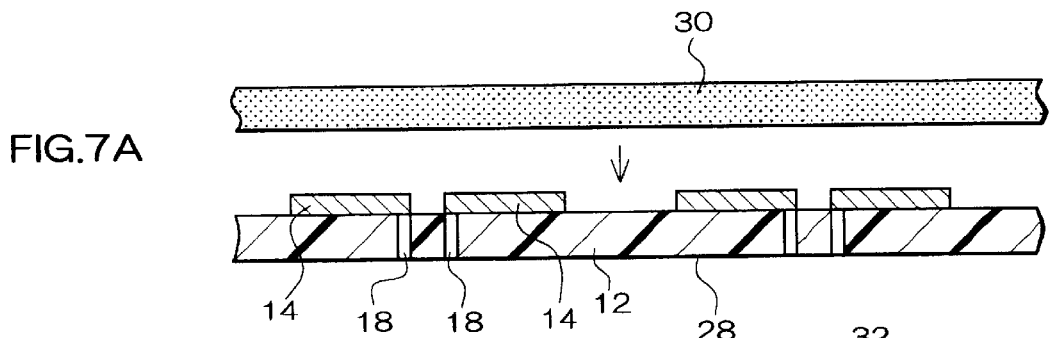
FIGS. 7A to 7D further illustrate the method of fabricating a semiconductor device in accordance with the first embodiment.

A step of applying an anisotropic conductive film to the rectangular substrate 28 is shown in FIG. 7A. The anisotropic conductive film 30 is formed of electrically conductive particles (electrically conductive filler) dispersed within an adhesive (binder), so a dispersion agent may be added thereto. The anisotropic conductive film 30 could be affixed as a previously formed sheet to the rectangular substrate 28, or it could be provided as a liquid onto the rectangular substrate 28. Note that a thermosetting adhesive is often used as the adhesive for this anisotropic conductive film 30. The anisotropic conductive film 30 is provided over at least the bonding portions 14. Alternatively, this step could be simplified by providing the anisotropic conductive film 30 so as to cover the entire rectangular substrate 28. It should be noted that subsequent handling of the rectangular substrate 28 can be facilitated by providing the anisotropic conductive film 30 on the rectangular substrate 28 except for the outer peripheral edges thereof, so that the anisotropic conductive film 30 is not affixed to the outer peripheral surfaces of the rectangular substrate 28.

Figure 7B:
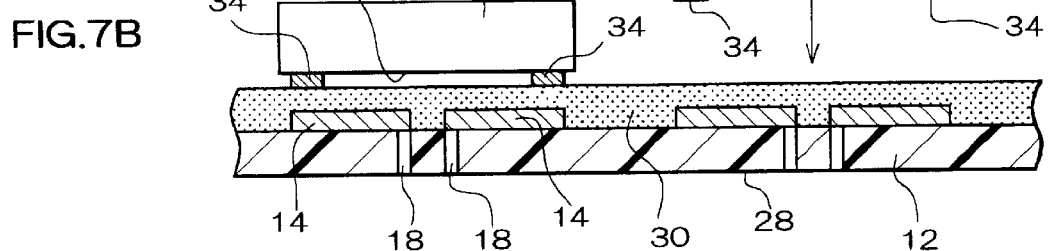

A plurality of semiconductor chips 32 are then mounted on the anisotropic conductive film 30, as shown in FIG. 7B (face-down bonding step). As described previously, the bonding portions 14 are formed in a plurality of rows and a plurality of columns on the rectangular substrate 28, and individual semiconductor chips 32 are mounted on the bonding portions 14. Each semiconductor chip 32 is provided with a plurality of electrodes 34, and a surface 36 thereof on which the electrodes 34 are provided is mounted on top of the anisotropic conductive film 30. The bonding portions 14 are formed in correspondence with the disposition of the electrodes 34, and the semiconductor chips 32 are mounted with the electrodes 34 positioned appropriately. This positioning can be done by using the positioning holes 20. Alternatively, a dedicated identification pattern could be used. Note that it is preferable to form lands on the bonding portions 14 that are wider than the other portions of an interconnecting pattern, at positions corresponding to the electrodes 34.

The semiconductor chips 32 could be mounted individually on the anisotropic conductive film 30 or a plurality of the semiconductor chips 32 could be mounted thereon simultaneously. For example, the same number of semiconductor chips 32 as the total number of bonding portions 14 could be mounted on a single rectangular substrate 28 at the same time.

It should be noted that the semiconductor chips 32 could be such that electrodes 34 are formed along only two edges thereof, or the electrodes 34 could be formed along all four edges thereof. These electrodes 34 are often provided as metal or solder protuberances on aluminum pads, but protuberances could equally well be provided on the bonding portions 14 or the bonding portions 14 could be etched to form protuberances.

The anisotropic conductive film 30 is interposed by the above steps between the surface 36 of the semiconductor chip 32 on which the electrodes 34 are formed and the surface of the rectangular substrate 28 on which the bonding portions 14 are formed. It is preferable to move on to the next step once the mounting of all of the semiconductor chips 32 is completed, even if the semiconductor chips 32 are mounted individually.

Figure 7C:
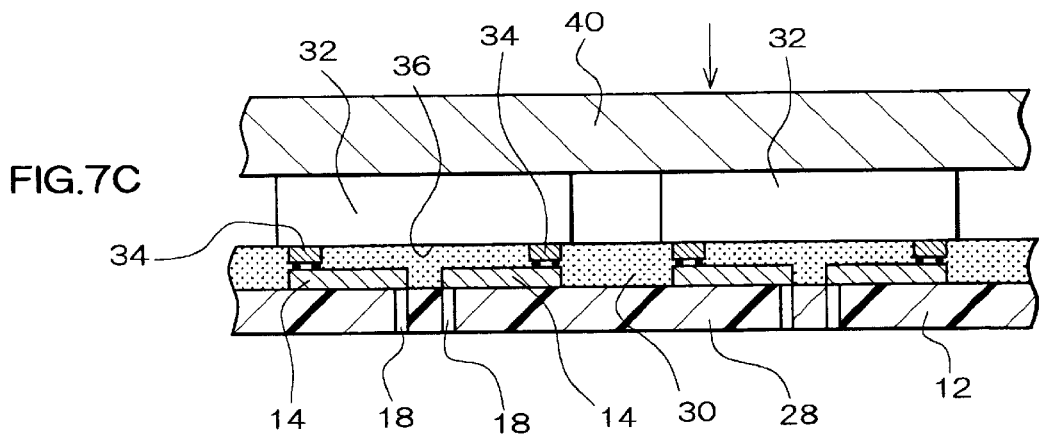

A tool 40 is then used to apply pressure to the surface of each semiconductor chip 32 opposite to the surface on which the electrodes 34 are formed, as shown in FIG. 7C, to press the semiconductor chips 32 in the direction of the bonding portions 14. A heater (not shown in the figure) is incorporated within the tool 40 to heat the semiconductor chips 32. Note that the pressure could be applied to a plurality of semiconductor chips 32 in a batch, as shown in the figure, or to each semiconductor chip 32 individually.

The electrodes 34 of the semiconductor chips 32 are brought into electrical contact with the bonding portions 14 by the electrically conductive particles of the anisotropic conductive film 30. In this embodiment of the invention, the anisotropic conductive film 30 underfills the spaces between the semiconductor chips 32 and the substrate 12 at the same time as the electrical connections between the bonding portions 14 and the electrodes 34 are made, enabling the fabrication of a semiconductor device by a method that has superior reliability and productivity.

Since the semiconductor chips 32 are also heated by the tool 40, the adhesive in the anisotropic conductive film 30 hardens in at least the regions thereof in contact with the surface 36 of the semiconductor chips 32. Energy could be added to the adhesive, depending on the hardening mechanism of the adhesive that is used.

Figure 7D:
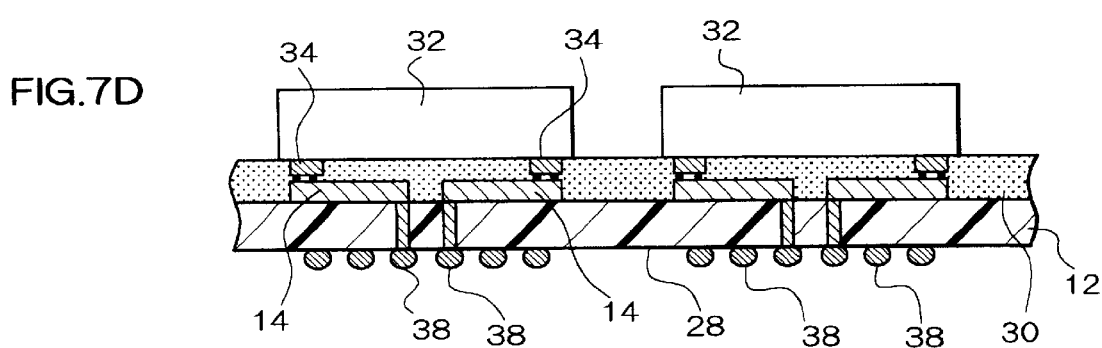

The external electrodes 38 are then provided for the rectangular substrate 28, as shown in FIG. 7D. For that purpose, solder is first provided within the through-holes 18 of the rectangular substrate 28 and around the periphery thereof. A cream solder could be used, by way of example, and it could be applied by printing. Alternatively, previously formed solder balls could be placed at these positions, in which case the positioning of the solder balls could be done with the aid of the positioning holes 20.

The solder is then heated to melt it in a reflow step, so that the solder is formed into ball shapes by surface tension, to form the external electrodes 38. The external electrodes 38 are on a surface on the opposite side of the bonding portions 14, but are in electrical contact with the bonding portions 14 through the through-holes 18. The bonding portions 14 are also connected electrically to the electrodes 34 of the semiconductor chips 32. Therefore the external electrodes 38 are connected electrically to the electrodes 34 of the semiconductor chips 32.

Note that the assembly can be washed, marked, and cured after the formation of the external electrodes 38, if necessary. These steps can also be performed while making use of the positioning enabled by the positioning holes 20, if necessary.

Figure 8:
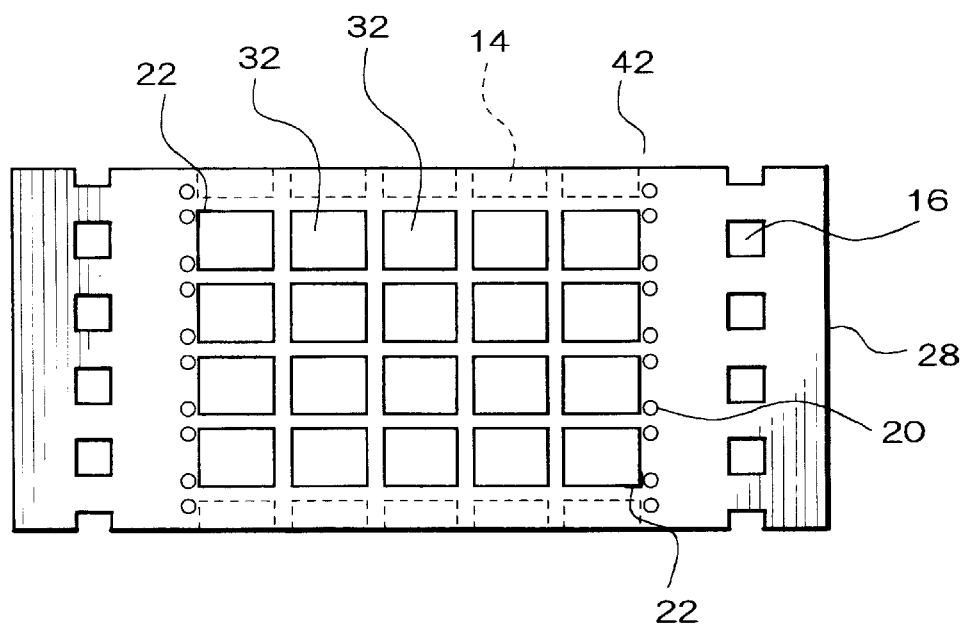
FIG. 8 further illustrates the method of fabricating a semiconductor device in accordance with the first embodiment.

A semiconductor module 42 shown in FIG. 8 is obtained by the above steps. This semiconductor module 42 encapsulates semiconductor devices arranged in a plurality of rows and a plurality of columns. The semiconductor module 42 comprises the rectangular substrate 28 on which are formed the bonding portions 14 in a plurality of rows and a plurality of columns. One semiconductor chip 32 is mounted on each of the bonding portions 14 of the rectangular substrate 28. The bonding portions 14 are placed in electrical contact with the electrodes 34 of the semiconductor chips 32 by the anisotropic conductive film 30. The external electrodes 38, which are placed in electrical contact with the bonding portions 14 through the through-holes 18, are provided on a surface of the rectangular substrate 28 that is on the opposite side from the bonding portions 14. Therefore, each of the semiconductor chips 32 arrayed in a plurality of rows and a plurality of columns has external electrodes 38 in electrical contact with the electrodes 34 thereof. Thus a semiconductor device is configured of each of the semiconductor chips 32. If the rectangular substrate 28 is then divided into individual units corresponding to each of the semiconductor chips 32, these individual units are complete semiconductor devices. The rectangular substrate 28 could be punched out into individual units, as one example of the step of separating the rectangular substrate 28 into individual units. The positioning holes 20 can also be used for positioning during the punching out of the rectangular substrate 28. Some defective portions will be detected during the fabrication of the tape carrier, but the locations thereof can be designated by defective substrate identification marks so that good-quality chips are not mounted thereon. This ensures that no further value is added to defects. In addition, if these locations are to be made uniform for subsequent steps (such as a solder ball formation step), defective semiconductor chips could be mounted thereon as dummies which can be identified as defective once they are separated into individual units later.

Figure 9:
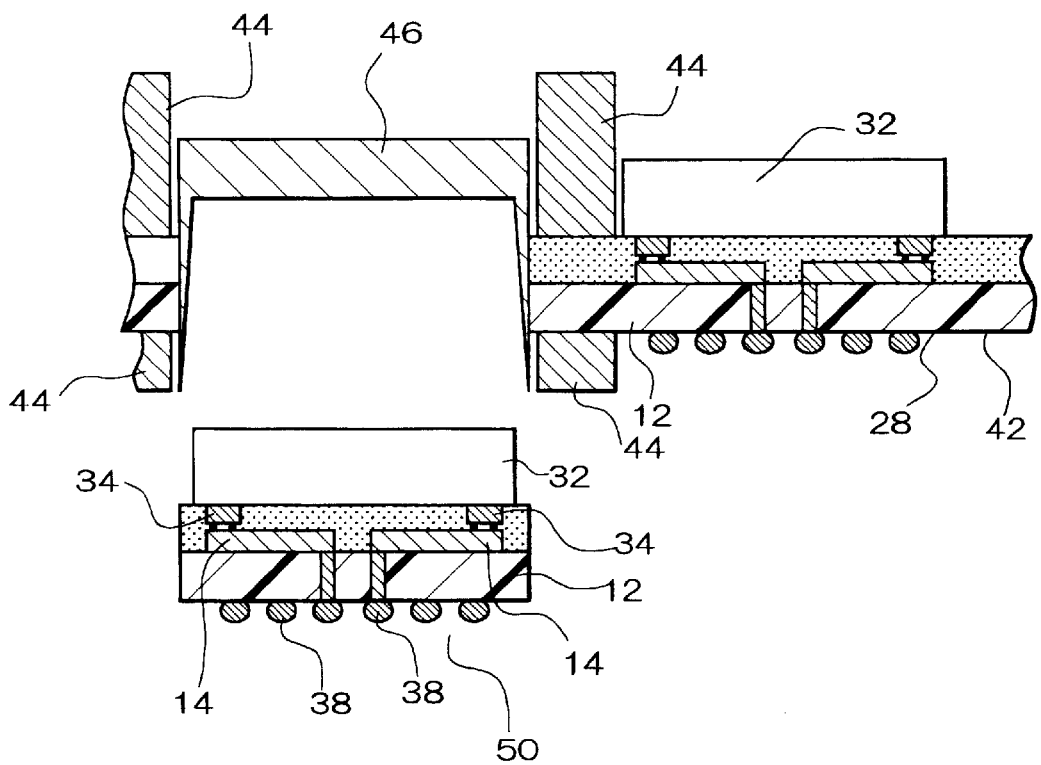
FIG. 9 further illustrates the method of fabricating a semiconductor device in accordance with the first embodiment.

A step of punching out the semiconductor module 42 into individual units is shown in FIG. 9. In this figure, the periphery of each semiconductor chip 32 on the rectangular substrate 28 is held by a fixed tool 44 such as fixed blades. A movable tool 46 such as movable blades punches out the periphery of the semiconductor chip 32. Thus individual units, in other words, semiconductor devices 50, are obtained.

Further steps such as external inspection, electrical checks, and burn-in are performed on each semiconductor device 50 as necessary.

With this embodiment of the invention, the bonding portions 14 and the electrodes 34 are connected electrically by the anisotropic conductive film 30, so that semiconductor devices 50 can be fabricated by a method that has superior reliability and productivity. A plurality of bonding portions 14 are formed across the width of the tape carrier 10, and a semiconductor chip 32 is connected to each of the bonding portions 14. Therefore, a plurality of semiconductor chips 32 are mounted in a matrix form, making the semiconductor device 50 of this embodiment suitable for large-volume production. In addition, the anisotropic conductive film 30 is affixed, the semiconductor chips 32 are mounted and pressured, the external electrodes 38 are formed, and the individual units are punched out after the tape carrier 10 has been wound onto the reel 24 in preparation then cut into rectangular substrates 28. Since at least one step is performed on the rectangular substrates 28, handling could be easier than in a case in which all of the steps are performed by reel-to-reel operations.

Even if all of the steps up until the cutting into individual units are performed by reel-to-reel operations, there are rows in which no semiconductor chips are mounted, increasing the flexibility in the winding direction, and thus facilitating fabrication by reel-to-reel operations and improving the yield.

It should be noted that other types of tape such as double-sided wiring tape, built-up wiring tape, or glass epoxy tape could be used as the tape carrier 10, if it can be provided by reels, instead of the previously described two-layer or three-layer tape. In other words, any tape can be used therefore, provided it is of a material that is flexible enough to be wound onto reels and also wiring can be formed thereon. This point is also relevant for the embodiments described below.

Second Embodiment

Figure 10:
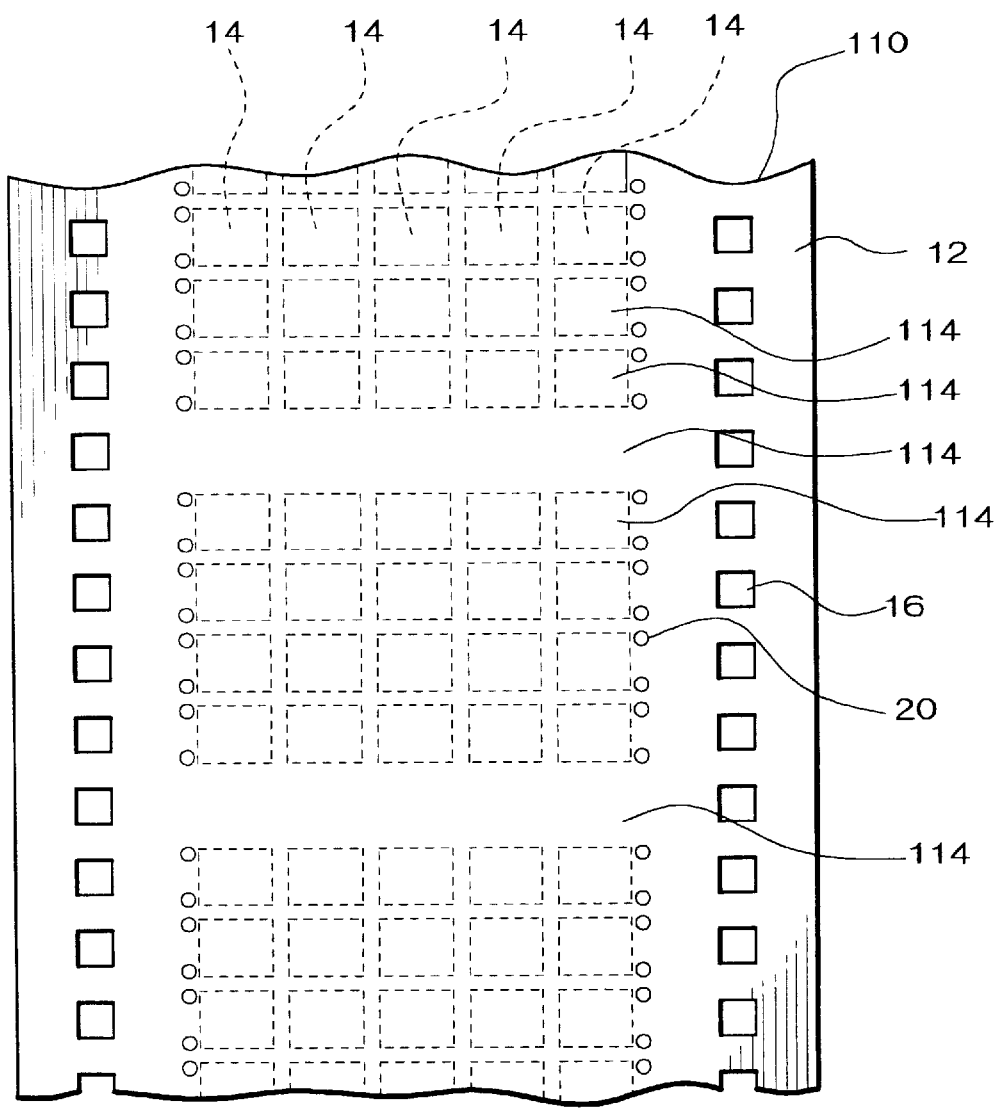
FIG. 10 illustrates a method of fabricating a semiconductor device in accordance with a second embodiment to which this invention is applied.
Figure 11A:
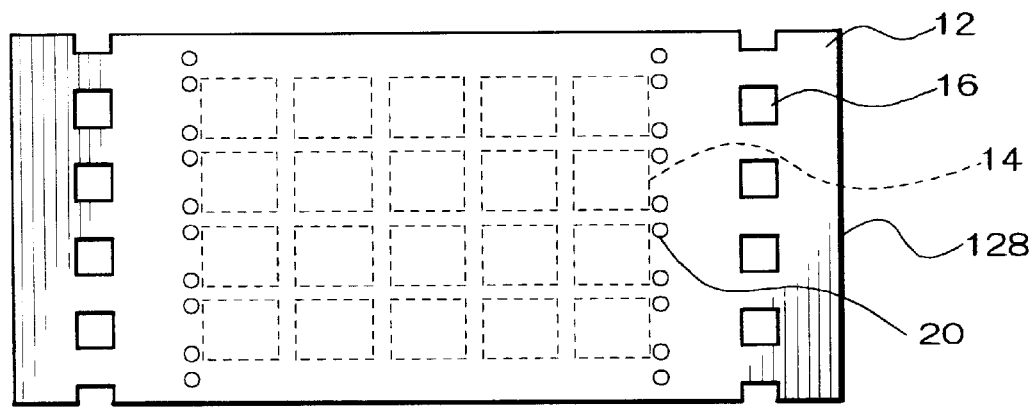
FIGS. 11A and 11B further illustrate the method of fabricating a semiconductor device in accordance with the second embodiment.
Figure 11B:
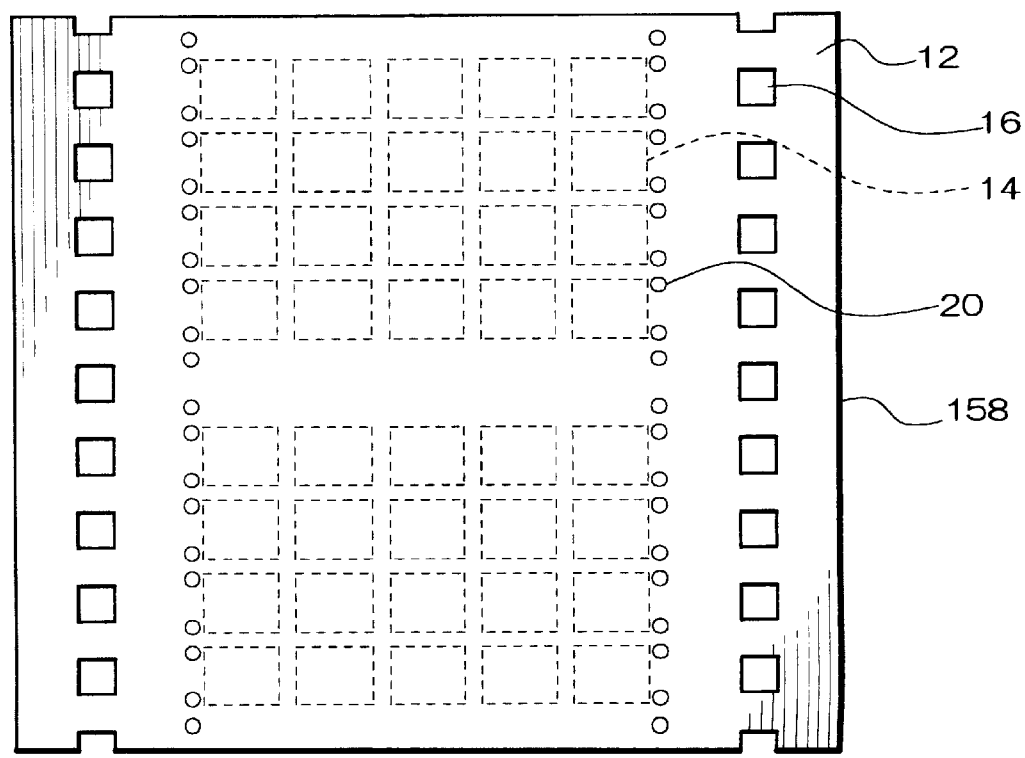

A method of fabricating a semiconductor device in accordance with a second embodiment of this invention is shown in FIGS. 10 to 11B. FIG. 10 shows a tape carrier 110 that is used in this embodiment.

The tape carrier 110 is configured in such a manner that there are no lines of bonding portions 14 outside the sections delimited by the identification marks 22 on the tape carrier 10 of FIG. 1. In addition, since the omission of a line of bonding portions 14 acts as a mark in itself, the identification marks 22 are also omitted.

More specifically, with any one region 114 for the formation of a line of the bonding portions 14 across the width of the tape carrier 110 acting as a base line, the bonding portions 14 are formed on the tape carrier 110, except for the (integer n×constant k)th lines of the regions 114 for the formation of the bonding portions 14 in the longitudinal direction. In the example shown in FIG. 10, for example: k=5. Therefore, when any one region 114 for the formation of a line of bonding portions 14 acts as a base line, the bonding portions 14 are not formed on the 5th, 10th, 15th, 20th, etc., regions 114 in the longitudinal direction.

With any one line of the region 114 acting as a base line, the tape carrier 110 can be cut at the (integer n×constant d)th lines of the regions 114 in the longitudinal direction of the tape carrier 110.

If k=d, a rectangular substrate 128 as shown in FIG. 11A is obtained by cutting the tape carrier 110 at all of the regions 114 in which no bonding portions 14 are formed.

Alternatively, if k<d, the tape carrier 110 is cut at a specific multiple of the regions 114 in which no bonding portions are formed. If d=10, for example, with any one line of the region 114 acting as a base line, the tape carrier 110 is cut at the 10th, 20th, 30th, etc., regions 114 in the longitudinal direction. A rectangular substrate 158 as shown in FIG. 11B is obtained thereby.

With this embodiment of the invention, the bonding portions 14 are not formed in the region 114 for the formation of a line of bonding portions 14 at the positions at which the rectangular substrate 128 or 158 is to be cut. This makes it possible to ensure wider cutting regions. As a result, not only is the cutting operation facilitated, but no stress is imparted to the remaining bonding portions 14 on the substrate 128 or 158 during the cutting, enabling an improvement in the yield. Moreover, the regions 114 in which no bonding portions 14 are formed ensure that there is sufficient area for forming the bonding portions 14, so there is no slippage in the positions at which the bonding portions 14 are formed. It is therefore not difficult to identify the positions of the bonding portions 14.

A semiconductor device can be obtained by subsequently mounting the semiconductor chips 32 used in the first embodiment onto the rectangular substrate 128, forming the external electrodes 38, and fabricating a semiconductor module therefrom. The remaining details are the same as those of the first embodiment, so further description thereof is omitted.

Third Embodiment

Figure 12:
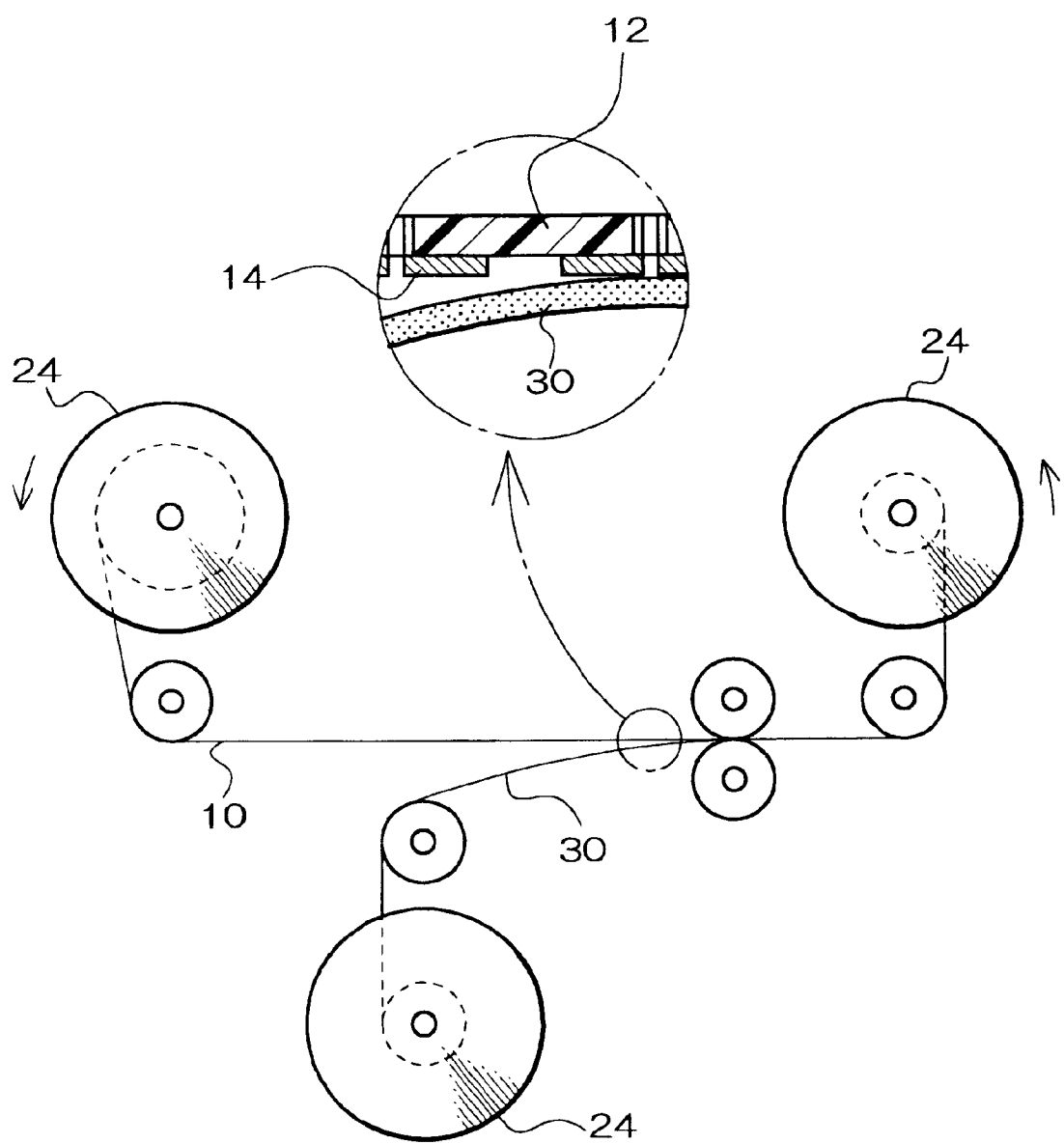
FIG. 12 illustrates a method of fabricating a semiconductor device in accordance with a third embodiment to which this invention is applied.
Figure 13:
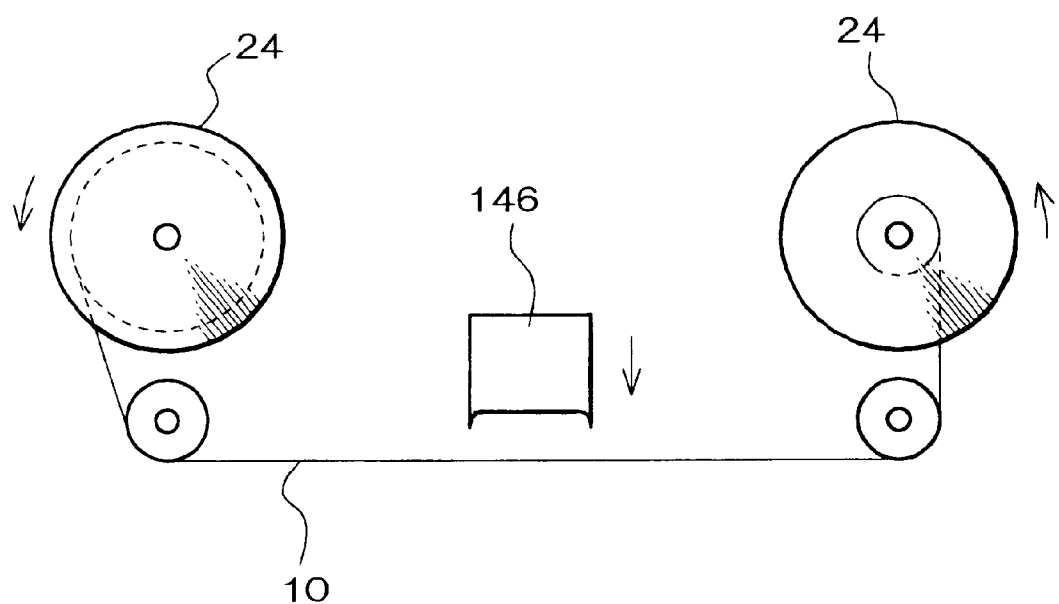
FIG. 13 further illustrates the method of fabricating a semiconductor device in accordance with the third embodiment.

A method of fabricating a semiconductor device in accordance with a third embodiment of this invention is shown in FIGS. 12 and 13. In the previously described embodiments, a step of providing an anisotropic conductive film, a step of mounting semiconductor chips, a step of applying pressure to the semiconductor chips, a step of providing external electrodes, and a step of punching out individual units are performed after the tape carrier has been cut into rectangular substrates. However, the present invention is not limited thereto and thus all of the steps can be performed on a tape carrier that is not cut into rectangular substrates. The advantages of this were described previously in the section on the first embodiment.

A step of applying an anisotropic conductive film to the tape carrier is shown in FIG. 12. The tape carrier 10 of FIG. 1 is used in this embodiment of the invention. The tape carrier 10 is wound onto the reel 24 in preparation, as shown in FIG. 12, and the configuration is such that it can be wound onto another reel 24. In other words, reel-to-reel steps are utilized in this embodiment. The anisotropic conductive film 30 is affixed to the tape carrier 10 between the two reels 24. In this case, the anisotropic conductive film 30 is preferably of a tape form, and is wound onto a reel 124 in preparation. The anisotropic conductive film 30 is affixed sequentially to the tape carrier 10, then the tape carrier 10 is wound temporarily onto a reel.

In a similar manner, the reel-to-reel operation is repeated to mount a plurality of semiconductor chips in sequence onto the tape carrier 10, and the tape carrier 10 is again wound temporarily onto a reel. This reel-to-reel operation is again utilized to apply pressure in sequence to the mounted semiconductor chips to connect them electrically to the interconnecting pattern, and the tape carrier 10 is again wound temporarily onto a reel. The reel-to-reel operation is again utilized to provide external electrodes in sequence for all of the semiconductor chips, and the tape carrier 10 is yet again wound temporarily onto a reel. These steps are the same as those of the first embodiment, except for the reel-to-reel operations, so further description thereof is omitted.

In a final reel-to-reel operation, the individual units are punched out, as shown in FIG. 13. In other words, the tape carrier 10 on which are mounted the semiconductor chips (not shown in the figure) is punched out by a jig 146 into individual units that correspond to the semiconductor chips. An enlargement of the punching section would be similar to that shown in FIG. 9. In this manner, semiconductor devices can be obtained in a similar manner to the previous embodiments.

Note that not all of these steps need be performed in a reel-to-reel; the tape carrier 10 could be cut into rectangular substrates at any point during the process. The timing of the cutting could be at any point, such as after the anisotropic conductive film is provided but before the semiconductor chips are mounted, after the semiconductor chips are mounted but before they are pressed, after the semiconductor chips are pressed but before the external electrodes are provided, or after the external electrodes are provided but before the individual units are punched out.

Figure 14:
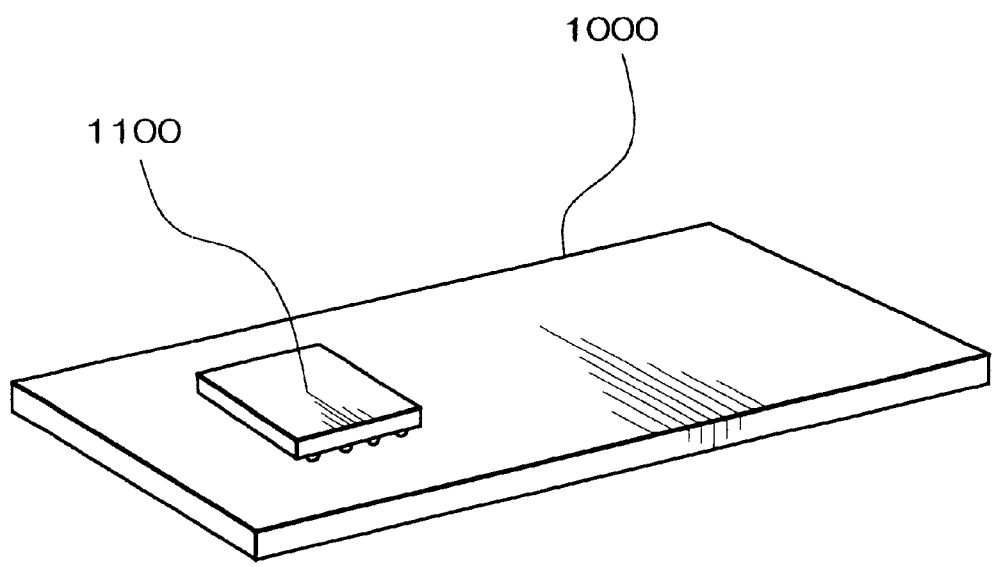
FIG. 14 shows a circuit board on which is mounted the semiconductor device of this invention.

A circuit board 1000 shown in FIG. 14 has mounted thereon a semiconductor device 1100 fabricated by the above described method of this embodiment. An organic substrate such as a glass epoxy substrate is generally used for this circuit board 1000. Bonding portions of a material such as copper are formed as the circuits that are required on the circuit board 1000. Electrical conduction is enabled by mechanically connecting the bonding portions to external electrodes of the semiconductor device 1100.

Note that the semiconductor device 1100 needs a small mounting area reduced down to that required for bare chip mounting, making it possible to design a more compact piece of electronic equipment that uses this circuit board 1000. Moreover, since more mounting space is available, it is possible to incorporate more functions in a certain area.

Figure 15:
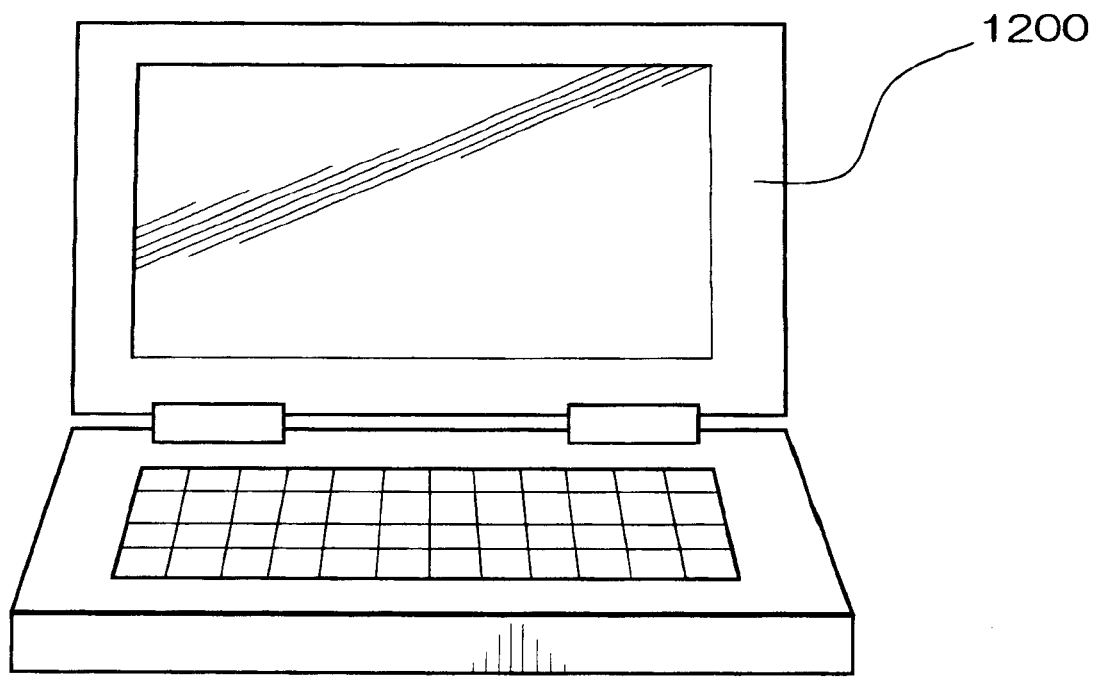
FIG. 15 shows electronic equipment that is provided with a circuit board on which is mounted the semiconductor device of this invention.

A notebook computer 1200 that is an example of electronic equipment provided with this circuit board 1000 is shown in FIG. 15.

Note that the present invention is applicable to various electronic components for surface mounting, regardless of whether they are active components or passive components. Examples of applicable electronic components include resistors, capacitors, coils, oscillators, filters, temperature sensors, thermistors, varistors, variable resistors, and fuses.

Further Embodiments

Figure 16:
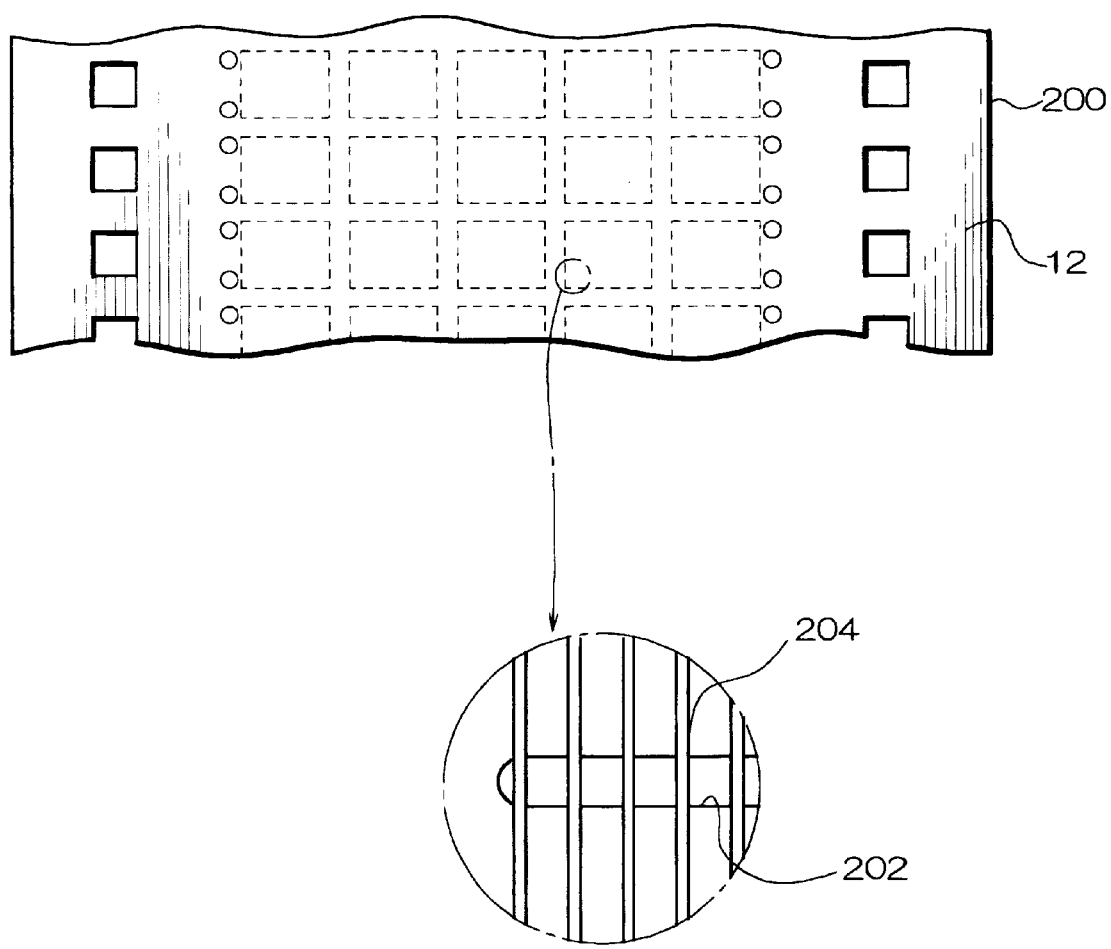
FIG. 16 shows a tape carrier in accordance with another embodiment of this invention.

A tape carrier in accordance with another embodiment of this invention is shown in FIG. 16. At least one hole 202 is formed in the substrate 12 of a tape carrier 200 shown in this figure, with a portion thereof being shown in enlargement. The hole 202 is preferably an elongated hole that extends in the widthwise direction of the tape carrier 200. In addition, a plurality of these holes 202 can be formed aligned in the widthwise direction of the tape carrier 200. The formation of the holes 202 make it easy for the substrate 12 to bend, thus making it easy to wind the tape carrier 200 onto a reel. Note that an interconnecting pattern 204 could traverse the holes 202.

Figure 17:
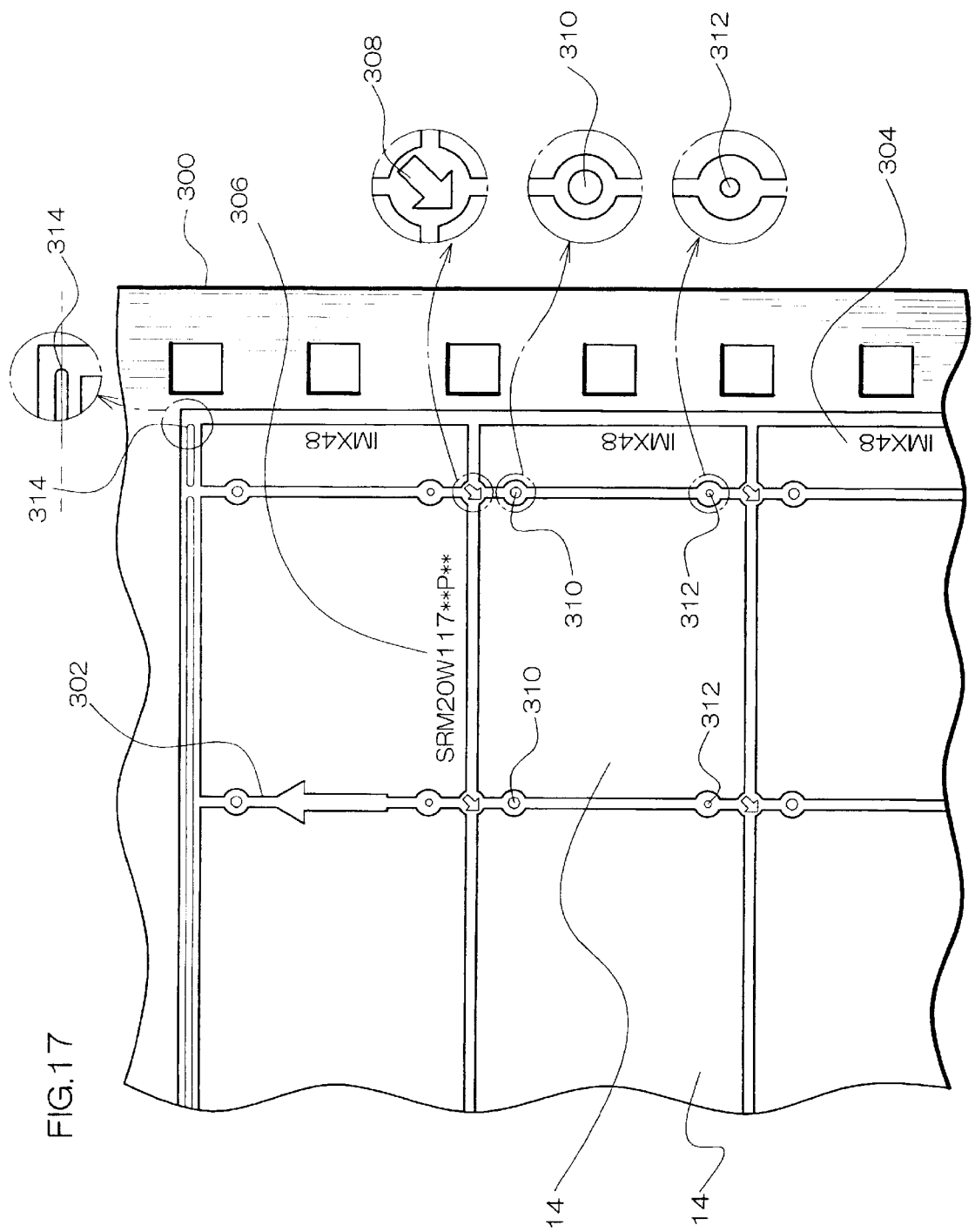
FIG. 17 shows a tape carrier in accordance with yet another embodiment of this invention.

A tape carrier in accordance with a still further embodiment of this invention is shown in FIG. 17. An arrow 302 indicating a longitudinal direction is formed in a tape carrier 300 shown in this figure. The arrow 302 indicates the direction when the tape carrier 300 is being passed from one reel to another.

A first product name 304 is formed on the tape carrier 300 to create horizontal writing in the longitudinal direction thereof. The first product name 304 is written in a direction that makes it easy for operators to read when the tape carrier is being passed from one reel to another. The first product name 304 shown in FIG. 17 is "1M×48," which means that it is for the fabrication of a semiconductor device having 48 external terminals, with a 1-megabyte semiconductor chip mounted thereon. A second product name 306 is formed on the tape carrier 300 to create horizontal writing in the widthwise direction thereof. The second product name 306 gives further details than the first product name 304.

Individual defect marks 308 are formed on the tape carrier 300. Each individual defect mark 308 is formed in an arrow shape, for example, in such a manner as to specify one of the bonding portions 14. The individual defect mark 308 is punched out if the corresponding bonding portion 14 is defective. Note that it is preferable to mount something of the same shape as good-quality semiconductor chips on a bonding portion 14 that has been designated as defective by the individual defect mark 308. A defective semiconductor chip could be mounted thereon, for example. If that is done, solder balls can be provided on defective bonding portions 14 as well.

Identification marks 310 and 312 for identifying positions of the lands of the bonding portions 14 are formed in the tape carrier 300. When the bonding portions 14 are rectangular, the identification marks 310 and 312 could be formed at positions at the four corners or close to the four corners thereof, by way of example. In the example shown in FIG. 17, the identification mark 310 is formed at a position that is close to one of a pair of corners positioned at the ends of a diagonal line across the rectangular bonding portion 14, and the identification mark 312 is formed at a position that is close to the other corner. The identification mark 310 and the other identification mark 312 could be shaped differently, as shown in the enlargements. If the direction of the tape carrier 300 has become reversed, this could be detected by detecting the difference in shape between the identification marks 310 and 312.

A cutting mark 314 is formed in the tape carrier 300 to indicate the position at which it is to be cut, as shown in FIG. 4. In the example shown in FIG. 17, there is a cutting mark 314 in a region between two plated leads that extend along the cutting position. This ensures that the cutting position is between the plated leads so that the plated leads are not cut, thus ensuring that no metal fragments are generated during the cutting.

It is preferable that all, or at least one, of the first and second product names 304 and 306, the individual defect mark 308, and the identification marks 310 and 312 are formed of the same material as that of the bonding portions 14 and at the same time as the formation of the bonding portions 14.

What is claimed is:

1. A method of fabricating a semiconductor device, comprising the steps of:
    affixing semiconductor chips by an adhesive to a tape carrier on which are formed bonding portions in a matrix, said tape carrier having a surrounding portion around each of said bonding portions;
    connecting electrodes formed on said semiconductor chips electrically to said bonding portions; and
    dividing said tape carrier into individual units for each of said semiconductor chips leaving at least a part of said surrounding portion.

2. The method of fabricating a semiconductor device as defined in claim 1, further comprising a step of forming a plurality of external electrodes on said tape carrier.

3. The method of fabricating a semiconductor device as defined in claim 1,
    wherein said step of dividing said tape carrier into individual units involves stamping said tape carrier into individual units.

4. The method of fabricating a semiconductor device as defined in claim 1,
    wherein electrically conductive particles are dispersed within said adhesives whereby said bonding portions and said semiconductor chips are electrically connected.

5. The method of fabricating a semiconductor device as defined in claim 1,
    wherein said tape carrier is unwound from a reel, and said tape carrier is wound onto another reel while the execution of at least one of said steps of said method, in preparation for a next step.

6. The method of fabricating a semiconductor device as defined in claim 1,
    wherein at least one of said steps of said method is performed after a step of cutting said tape carrier into rectangular substrates of a length comprising a plurality of said bonding portions in the longitudinal direction of said tape carrier.

7. The method of fabricating a semiconductor device as defined in claim 1,
    wherein sprocket holes and positioning holes are formed in said tape carrier; and
    wherein said steps of said method are performed by utilizing said positioning holes.

8. The method of fabricating a semiconductor device as defined in claim 1,
    wherein through-holes are formed in said tape carrier; and
    wherein said external electrodes are connected to said bonding portions through said through-holes, and are also provided on a surface on the opposite side from the surface on which said bonding portions are formed.

9. The method of fabricating a semiconductor device as defined in claim 8,
    wherein said step of forming said external electrodes on said tape carrier comprises a step of mounting a material for forming said external electrodes onto said tape carrier and a reflow step of heating and melting said material to form ball shapes.

10. A semiconductor device fabricated by the method as defined in claim 1.

11. The method of fabricating a semiconductor device as defined in claim 4,
    wherein said adhesive is interposed between said bonding portions and surfaces of said semiconductor chips bearing said electrodes, then pressure is applied between said semiconductor chips and said tape carrier, whereby connections between said electrodes formed on said semiconductor chips and said bonding portions are performed via said electrically conductive particles.

12. The method of fabricating a semiconductor device as defined in claim 6,
    wherein identification marks are formed in said tape carrier, for delimiting said bonding portions at positions within regions at which said tape carrier is to be cut into said rectangular substrates.

13. The method of fabricating a semiconductor device as defined in claim 6,
    wherein said step of cutting said tape carrier into rectangular substrates is performed before said semiconductor chips are affixed to said tape carrier; and
    wherein said tape carrier is cut on widthwise lines of said bonding portions that are the (integer n×constant d)th widthwise lines of said bonding portions in the longitudinal direction, with any one line of said bonding portions across the width of said tape carrier acting as a base line.

14. The method of fabricating a semiconductor device as defined in claim 6,
    wherein said step of affixing said semiconductor chips to said tape carrier is performed before said step of cutting said tape carrier into rectangular substrates;
    wherein said semiconductor chips are mounted on said bonding portions, except for said bonding portions in the (integer n×constant k)th widthwise lines of said bonding portions in the longitudinal direction, with any one line of said bonding portions across the width of said tape carrier acting as a base line; and
    wherein said tape carrier is cut on widthwise lines of interconnecting pattern that are the (integer n×constant d)th (where k≦d) widthwise lines of said interconnecting pattern in the longitudinal direction from said base line.

15. The method of fabricating a semiconductor device as defined in claim 6, wherein said bonding portions are formed on said tape carrier, except for widthwise lines of regions for the formation of said bonding portions that are the (integer n×constant k)th widthwise lines of said regions for the formation of said bonding portions in the longitudinal direction, with any one line of said region for the formation of said bonding portions acting as a base line;

wherein said step of cutting said tape carrier into rectangular substrates is performed before said semiconductor chips are affixed to said tape carrier; and wherein said tape carrier is cut on widthwise lines of said regions for the formation of interconnecting pattern that are the (integer n×constant d)th (where k≦d) widthwise lines of said regions for the formation of said interconnecting pattern in the longitudinal direction from said base line.

16. The method of fabricating a semiconductor device as defined in claim 6, wherein said bonding portions are formed on said tape carrier, except for widthwise lines of regions for the formation of said bonding portions that are the (integer n×constant k)th widthwise lines of said regions for the formation of said bonding portions in the longitudinal direction, with any one line of said region for the formation of said bonding portions acting as a base line;

wherein said step of affixing said semiconductor chips to said tape carrier is performed before said step of cutting said tape carrier into rectangular substrates;

wherein said semiconductor chips are affixed to said tape carrier only on regions wherein said bonding portions are formed; and wherein said tape carrier is cut on widthwise lines of said regions for the formation of interconnecting pattern that are the (integer n×constant d)th (where k≦d) widthwise lines of said regions for the formation of said interconnecting pattern in the longitudinal direction from said base line.

17. A circuit board on which the semiconductor device as defined in claim 10 is mounted.

18. Electronic equipment having the circuit board as defined in claim 17.

19. A semiconductor module comprising:

a rectangular substrate on which electrically conductive bonding portions are formed in a matrix, said rectangular substrate having a spacing portion between adjacent two of said bonding portions;

a plurality of semiconductor chips to be disposed at positions corresponding to said bonding portions; and an adhesive for connecting said rectangular substrate and said semiconductor chips, said adhesive provided continuously over said adjacent two of said bonding portions and said spacing portion.

20. The semiconductor module as defined in claim 19, wherein said adhesive is formed of an anisotropic conductive film;

wherein said anisotropic conductive film is interposed between surfaces of said semiconductor chips on which electrodes are formed and said bonding portions; and wherein said bonding portions and said electrodes are electrically connected by electrically conductive particles comprised within said anisotropic conductive film.

21. The semiconductor module as defined in claim 19, wherein through-holes are formed in said rectangular substrate; and wherein external electrodes are formed on a surface of said rectangular substrate opposite to a surface of said rectangular substrate on which said bonding portions are formed, to be connected electrically to said bonding portions by said through-holes.

22. A method of fabricating a semiconductor device, comprising the steps of:

affixing semiconductor chips by an adhesive to a tape carrier on which are formed bonding portions in a matrix;

connecting electrodes formed on said semiconductor chips electrically to said bonding portions;

holding by a fixing tool a portion of said tape carrier between adjacent two of said semiconductor chips; and dividing said tape carrier into individual units for each of said semiconductor chips.

23. The method of fabricating a semiconductor device as defined in claim 22, further comprising a step of forming a plurality of external electrodes on said tape carrier.

24. The method of fabricating a semiconductor device as defined in claim 22, wherein said step of dividing said tape carrier into individual units involves stamping said tape carrier into individual units.

25. The method of fabricating a semiconductor device as defined in claim 22, wherein electrically conductive particles are dispersed within said adhesive, whereby said bonding portions and said semiconductor chips are electrically connected.

26. The method of fabricating a semiconductor device as defined in claim 22, wherein said tape carrier is unwound from a reel, and said tape carrier is wound onto another reel while the execution of at least one of said steps of said method, in preparation for a next step.

27. The method of fabricating a semiconductor device as defined in claim 22, wherein at least one of said steps of said method is performed after a step of cutting said tape carrier into rectangular substrates of a length comprising a plurality of said bonding portions in the longitudinal direction of said tape carrier.

28. The method of fabricating a semiconductor device as defined in claim 22, wherein sprocket holes and positioning holes are formed in said tape carrier; and wherein said steps of said method are performed by utilizing said positioning holes.

29. The method of fabricating a semiconductor device as defined in claim 22, wherein through-holes are formed in said tape carrier; and wherein said external electrodes are connected to said bonding portions through said through-holes, and are also provided on a surface on the opposite side from the surface on which said bonding portions are formed.

30. A semiconductor device fabricated by the method as defined in claim 22.

31. The method of fabricating a semiconductor device as defined in claim 25, wherein said adhesive is interposed between said bonding portions and surfaces of said semiconductor chips bearing said electrodes, then pressure is applied between said semiconductor chips and said tape carrier, whereby connections between said electrodes formed on said semiconductor chips and said bonding portions are performed via said electrically conductive particles.

32. The method of fabricating a semiconductor device as defined in claim 27, wherein identification marks are formed in said tape carrier, for delimiting said bonding portions at positions within regions at which said tape carrier is to be cut into said rectangular substrates.

33. The method of fabricating a semiconductor device as defined in claim 27, wherein said step of cutting said tape carrier into rectangular substrates is performed before said semiconductor chips are affixed to said tape carrier; and wherein said tape carrier is cut on widthwise lines of said bonding portions that are the (integer n×constant d)th widthwise lines of said bonding portions in the longitudinal direction, with any one line of said bonding portions across the width of said tape carrier acting as a base line.

34. The method of fabricating a semiconductor device as defined in claim 27, wherein said step of affixing said semiconductor chips to said tape carrier is performed before said step of cutting said tape carrier into rectangular substrates;

wherein said semiconductor chips are mounted on said bonding portions, except for said bonding portions in the (integer n×constant k)th widthwise lines of said bonding portions in the longitudinal direction, with any one line of said bonding portions across the width of said tape carrier acting as a base line; and wherein said tape carrier is cut on widthwise lines of interconnecting pattern that are the (integer n×constant d)th (where k≦d) widthwise lines of said interconnecting pattern in the longitudinal direction from said base line.

35. The method of fabricating a semiconductor device as defined in claim 27, wherein said bonding portions are formed on said tape carrier, except for widthwise lines of regions for the formation of said bonding portions that are the (integer n×constant k)th widthwise lines of said regions for the formation of said bonding portions in the longitudinal direction, with any one line of said region for the formation of said bonding portions acting as a base line;

wherein said step of cutting said tape carrier into rectangular substrates is performed before said semiconductor chips are affixed to said tape carrier; and wherein said tape carrier is cut on widthwise lines of said regions for the formation of interconnecting pattern that are the (integer n×constant d)th (where k≦d) widthwise lines of said regions for the formation of said interconnecting pattern in the longitudinal direction from said base line.

36. The method of fabricating a semiconductor device as defined in claim 27, wherein said bonding portions are formed on said tape carrier, except for widthwise lines of regions for the formation of said bonding portions that are the (integer n×constant k)th widthwise lines of said regions for the formation of said bonding portions in the longitudinal direction, with any one line of said region for the formation of said bonding portions acting as a base line;

wherein said step of affixing said semiconductor chips to said tape carrier is performed before said step of cutting said tape carrier into rectangular substrates;

wherein said semiconductor chips are affixed to said tape carrier only on regions wherein said bonding portions are formed; and wherein said tape carrier is cut on widthwise lines of said regions for the formation of interconnecting pattern that are the (integer n×constant d)th (where k≦d) widthwise lines of said regions for the formation of said interconnecting pattern in the longitudinal direction from said base line.

37. The method of fabricating a semiconductor device as defined in claim 29, wherein said step of forming said external electrodes on said tape carrier comprises a step of mounting a material for forming said external electrodes onto said tape carrier and a reflow step of heating and melting said material to form ball shapes.

38. A circuit board on which the semiconductor device as defined in claim 30 is mounted.

39. Electronic equipment having the circuit board as defined in claim 38.

40. A semiconductor module comprising:

a rectangular substrate on which bonding portions are formed in a matrix, said rectangular substrate having marks for separating said bonding portions from said rectangular substrate; and a plurality of semiconductor chips to be disposed at positions corresponding to said bonding portions.

41. The semiconductor module as defined in claim 40, wherein said adhesive is formed of an anisotropic conductive film;

wherein said anisotropic conductive film is interposed between surfaces of said semiconductor chips on which electrodes are formed and said bonding portions; and wherein said bonding portions and said electrodes are electrically connected by electrically conductive particles comprised within said anisotropic conductive film.

42. The semiconductor module as defined in claim 40, wherein said through-holes are formed in said rectangular substrate; and wherein external electrodes are formed on a surface of said rectangular substrate opposite to a surface of said rectangular substrate on which said bonding portions are formed, to be connected electrically to said bonding portions by said through-holes.

* * * * *